(12) United States Patent
Chhabra et al.

(10) Patent No.: US 8,753,449 B2
(45) Date of Patent: Jun. 17, 2014

(54) ENHANCEMENT IN UV CURING EFFICIENCY USING OXYGEN-DOPED PURGE FOR ULTRA LOW-K DIELECTRIC FILM

(71) Applicant: Applied Materials, Inc., Santa Clara, CA (US)

(72) Inventors: Mahendra Chhabra, Stanford, CA (US); Scott A. Hendrickson, Brentwood, CA (US); Sanjeev Baluja, Campbell, CA (US); Tsutomu Kiyohara, Santa Clara, CA (US); Juan Carlos Rocha-Alvarez, San Carlos, CA (US); Alexandros T. Demos, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/904,468

(22) Filed: May 29, 2013

(65) Prior Publication Data

US 2013/0344704 A1 Dec. 26, 2013

Related U.S. Application Data

(60) Provisional application No. 61/664,032, filed on Jun. 25, 2012.

(51) Int. Cl.
| | | |
|---|---|---|
| *C25C 1/00* | (2006.01) | |
| *C23C 16/44* | (2006.01) | |
| *C23C 14/00* | (2006.01) | |
| *B05D 3/06* | (2006.01) | |
| *H01L 21/67* | (2006.01) | |
| *G02B 1/00* | (2006.01) | |

(52) U.S. Cl.
CPC ............. *C23C 16/4405* (2013.01); *C23C 14/00* (2013.01); *B05D 3/066* (2013.01); *H01L 21/6719* (2013.01); *G02B 1/00* (2013.01)

USPC .................. 134/1.1; 134/1.2; 134/31; 134/1; 118/723 R

(58) Field of Classification Search
CPC .......... C23C 16/00; C23C 14/00; B05D 3/00; G02B 1/00; H01L 21/00
USPC .................... 134/1.1, 31, 1, 1.2, 1.3, 21, 902; 118/723 R
See application file for complete search history.

(56) References Cited

U.S. PATENT DOCUMENTS

| | | |
|---|---|---|
| 6,614,181 B1 | 9/2003 | Harvey et al. |
| 6,756,085 B2 | 6/2004 | Waldfried et al. |

(Continued)

OTHER PUBLICATIONS

International Search Report and Written Opinion of the International Searching Authority mailed Aug. 27, 2013 in PCT/US13/044130.

(Continued)

*Primary Examiner* — Telly Green
(74) *Attorney, Agent, or Firm* — Patterson & Sheridan, LLP

(57) ABSTRACT

Embodiments of the invention provide methods for curing an ultra low-k dielectric film within a UV processing chamber. In one embodiment, the method includes depositing an ultra low-k dielectric layer on a substrate in a deposition chamber, and subjecting the deposited ultra low-k dielectric layer to a UV curing processes in a UV processing chamber. The method includes stabilizing the UV processing chamber by flowing an oxygen gas and a purge gas into the UV processing chamber at a flow ratio of about 1:50000 to about 1:100. While flowing the oxygen-doped purge gas, the substrate is exposed to UV radiation to cure the deposited ultra low-k dielectric layer. The inventive oxygen-doped purge curing process provides an alternate pathway to build silicon-oxygen network of the ultra low-k dielectric material, thereby accelerating cross-linking efficiency without significantly affecting the film properties of the deposited ultra low-k dielectric material.

17 Claims, 6 Drawing Sheets

(56) References Cited

U.S. PATENT DOCUMENTS

| | | | |
|---|---|---|---|
| 6,841,483 B2 * | 1/2005 | Zhu et al. | 438/710 |
| 7,265,061 B1 | 9/2007 | Cho et al. | |
| 7,288,292 B2 * | 10/2007 | Gates et al. | 427/489 |
| 7,297,376 B1 | 11/2007 | Yim et al. | |
| 7,695,765 B1 | 4/2010 | Fox et al. | |
| 7,803,722 B2 | 9/2010 | Liang | |
| 7,851,232 B2 | 12/2010 | van Schravendijk et al. | |
| 8,657,961 B2 * | 2/2014 | Xie et al. | 134/1.1 |
| 2002/0111036 A1 * | 8/2002 | Zhu et al. | 438/754 |
| 2003/0054115 A1 | 3/2003 | Albano et al. | |
| 2004/0018319 A1 | 1/2004 | Waldfried et al. | |
| 2004/0058090 A1 * | 3/2004 | Waldfried et al. | 427/558 |
| 2005/0276930 A1 * | 12/2005 | Gates et al. | 427/551 |
| 2006/0249175 A1 * | 11/2006 | Nowak et al. | 134/1 |
| 2006/0251827 A1 | 11/2006 | Nowak et al. | |
| 2006/0274405 A1 | 12/2006 | Waldfried et al. | |
| 2008/0026203 A1 * | 1/2008 | Gates et al. | 428/304.4 |
| 2008/0093709 A1 | 4/2008 | Matsuura et al. | |
| 2009/0061237 A1 | 3/2009 | Gates et al. | |
| 2009/0297823 A1 * | 12/2009 | Gates et al. | 428/315.5 |
| 2010/0018548 A1 * | 1/2010 | Yi et al. | 134/1 |
| 2011/0100394 A1 * | 5/2011 | Yi et al. | 134/1 |
| 2012/0090691 A1 * | 4/2012 | Baluja et al. | 137/13 |
| 2012/0156890 A1 * | 6/2012 | Yim et al. | 438/763 |
| 2013/0177706 A1 * | 7/2013 | Baluja et al. | 427/226 |
| 2013/0284204 A1 * | 10/2013 | Xie et al. | 134/1.1 |

OTHER PUBLICATIONS

Zakirov, A.D. "Effect of Ultraviolet Irradiation on the Defect States and the Charge Transport Properties of Low-k SiOC(-H) Dielectric Films Deposited by Using UV-assisted PECVD", Journal of the Korean Physical Society, vol. 58, No. 5, May 2011, pp. 13931397.

* cited by examiner

ENHANCEMENT IN UV CURING EFFICIENCY USING OXYGEN-DOPED PURGE FOR ULTRA LOW-K DIELECTRIC FILM

CROSS-REFERENCE TO RELATED APPLICATIONS

This application claims benefit of U.S. Provisional Patent Application Ser. No. 61/664,032, filed Jun. 25, 2012, entitled "ENHANCEMENT IN UV CURING EFFICIENCY USING OXYGEN-DOPED PURGE FOR ULTRA LOW-K DIELECTRIC FILM", which is herein incorporated by reference.

BACKGROUND

1. Field

Embodiments of the present invention generally relate to processing an ultra low-k dielectric film on a substrate with UV energy.

2. Description of the Related Art

Materials with low dielectric constants (low-k), such as silicon oxides ($SiO_x$), silicon carbides ($SiC_x$), and carbon doped silicon oxides ($SiOC_x$), find extremely widespread use in the fabrication of semiconductor devices. Using low-k materials as the inter-metal and/or inter-layer dielectric between conductive interconnects reduces the delay in signal propagation due to capacitive effects. The lower the dielectric constant of the dielectric layer, the lower the capacitance of the dielectric and the lower the RC delay of the integrated circuit (IC).

Current efforts are focused on improving low-k dielectric materials, often referred to as ultra low-k (ULK) dielectrics, with k values less than 2.5 for the most advanced technology needs. Ultra low-k dielectric materials may be obtained by, for example, incorporating air voids within a low-k dielectric matrix, creating a porous dielectric material. Methods of fabricating porous dielectrics typically involve forming a "precursor film" containing two components: a porogen (typically an organic material such as a hydrocarbon) and a structure former or dielectric material (e.g., a silicon containing material). Once the precursor film is formed on the substrate, the porogen component can be removed using a thermal process, such as an ultraviolet (UV) curing process, leaving a structurally intact porous dielectric matrix or oxide network. The UV curing process also strengthens the film by cross-linking the matrix, e.g., Si—O—Si or Si—C—Si chains in the carbon doped silicon oxides, yielding a low-k film that is both mechanically and chemically stronger.

Techniques for removing porogens from the precursor film include, for example, a thermal process in which the substrate is heated to a temperature sufficient for the breakdown and vaporization of the organic porogen. One known thermal process for removing porogens from the precursor film includes a UV curing process to aid in the post treatment of CVD silicon oxide films. However, various exposed surfaces of the optical components, such as the quartz based vacuum window or showerhead disposed in the UV processing chamber, can become coated with organic-based residues (from a porogen precursor) that requires periodic cleaning. Overall, curing process throughput (number of substrates processed per hour) is determined by time needed for curing, cleaning and substrate transferring. Optimization of any of these steps increases UV process efficiency, which also increases overall device manufacturing efficiency.

Therefore, a need exists to increase UV efficiency while maintaining the film properties of deposited ultra low-k dielectric materials.

SUMMARY OF THE INVENTION

Embodiments of the invention generally provide an improved method for curing an ultra low-k dielectric film within a UV processing chamber. The inventive method advantageously reduces UV cure time of deposited ultra low-k dielectric films by using an oxygen-doped purge gas during the UV curing process. In one embodiment, the method includes depositing an ultra low-k dielectric layer on a substrate in a deposition chamber, and subjecting the deposited ultra low-k dielectric layer to a densification process in an ultraviolet (UV) processing chamber. The densification process includes stabilizing the UV processing chamber by flowing a purge gas and an oxygen gas into the UV processing chamber, wherein the oxygen gas is flowed into the UV processing chamber at a flow rate of about 1 sccm to about 500 sccm, exposing the deposited ultra low-k dielectric layer to UV radiation, terminating flow of the oxygen gas while still flowing purge gas into the UV processing chamber with UV radiation turned off or remains on, and pumping residues out of the UV processing chamber.

In another embodiment, a method for processing a substrate in an ultraviolet (UV) processing chamber is provided. The method includes depositing a low-k dielectric layer on a substrate in a deposition chamber, and exposing the deposited low-k dielectric layer to UV radiation under an environment of oxygen-doped purge in a UV processing chamber to promote cross-linking process of back-bone structure matrix of the deposited low-k dielectric layer. The low-k dielectric layer is a porous silicon-based dielectric material such as carbon doped silicon oxides having back-bone structure matrix of Si—O—Si bonds. The method further includes flowing a purge gas comprising helium gas and argon gas into the UV processing chamber. In one example, the oxygen gas and the purge gas are introduced into the UV processing chamber at a flow ratio of about 1:32000 to about 1:50, or a broader range such as 1:50000 to about 1:100.

In yet another embodiment, a method for processing a substrate is provided. The method includes depositing an ultra low-k dielectric layer having a dielectric constant of less than about 2.5 on a substrate in a deposition chamber, transferring the substrate to an ultraviolet (UV) processing chamber, flowing a purge gas comprising helium gas, argon gas, and oxygen gas into the UV processing chamber, wherein the helium gas is flowed at a flow rate of about 16000 sccm or less, for example about 15000 sccm, the argon gas is flowed at a flow rate of about 16000 sccm or less, for example about 15000 sccm, and the oxygen gas is flowed at a flow rate of about 1 sccm to about 500 sccm, exposing the deposited ultra low-k dielectric layer to UV radiation, turning off UV radiation, terminating flow of the oxygen gas while still flowing helium gas and argon gas into the UV processing chamber at a flow rate of about 16000 sccm or less, for example about 15000 sccm, and pumping residues and unwanted produces out of the UV processing chamber. In one example, the method may further include rotating a UV lamp assembly at different circumferential positions between 90 degrees and 270 degrees, and/or at different circumferential positions between 0 degree and 180 degrees. Alternatively, the UV lamp may stay still while continuously rotating a substrate support upon which the substrate is disposed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide an improved method for curing an ultra low-k dielectric film within a UV processing chamber. In one embodiment where the deposited ultra low-k dielectric film is carbon doped silicon oxides, a purge gas doped with a small amount of oxygen is introduced into a UV processing chamber during subsequent UV curing process. Oxygen may act as a catalyst providing an alternate pathway to bonding network of the ultra low-k dielectric material, thereby accelerating cross-linking efficiency. The inventors have observed that the inventive oxygen-doped purge curing process can increase curing process efficiency up to 35% compared to conventional oxygen-free UV curing process, without significantly affecting the film properties of the deposited ultra low-k dielectric material.

Exemplary Hardware

Figure 1:
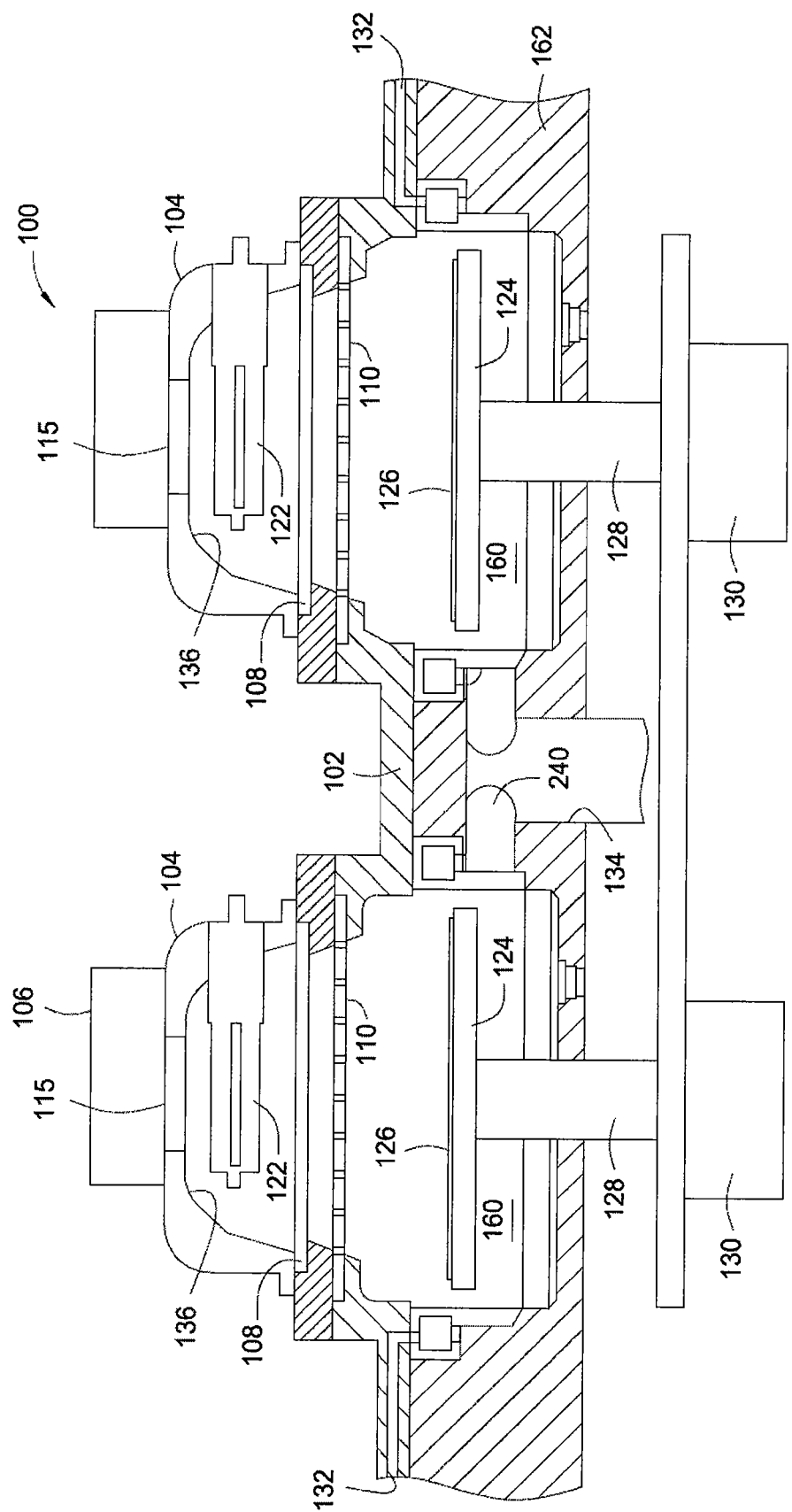
FIG. 1 is a partial cross-sectional section view of a tandem processing chamber that has a lid assembly with two UV bulbs disposed respectively above two processing regions.

FIG. 1 illustrates a cross-sectional view of an exemplary tandem processing chamber 100 that may benefit the present invention. The processing chamber 100 provides two separate and adjacent processing regions in a chamber body for processing the substrates. The processing chamber 100 has a lid 102, housings 104 and power sources 106. Each of the housings 104 cover a respective one of two UV lamp bulbs 122 disposed respectively above two processing regions 160 defined within the body 162. Each of the processing regions 160 includes a heating substrate support, such as substrate support 124, for supporting a substrate 126 within the processing regions 160. The UV lamp bulbs 122 emit UV light that is directed through the windows 108 and showerheads 110 onto each substrate located within each processing region. The substrate supports 124 can be made from ceramic or metal such as aluminum. The substrate supports 124 may couple to stems 128 that extend through a bottom of the body 162 and are operated by drive systems 130 to move the substrate supports 124 in the processing regions 160 toward and away from the UV lamp bulbs 122. The drive systems 130 can also rotate and/or translate the substrate supports 124 during curing to further enhance uniformity of substrate illumination. The exemplary tandem processing chamber 100 may be incorporated into a processing system, such as a Producer™ processing system, commercially available from Applied Materials, Inc., of Santa Clara, Calif. It is contemplated that the invention may be practiced in any processing chamber using thermal, UV, or plasma energy to cure the deposited dielectric film.

The UV lamp bulbs 122 can be an array of light emitting diodes or bulbs utilizing any of the state of the art UV illumination sources including, but not limited to, microwave arcs, radio frequency filament (capacitively coupled plasma) and inductively coupled plasma (ICP) lamps. The UV light can be pulsed during a cure process. Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position. The UV bulbs are a source of ultraviolet radiation, and may transmit a broad spectral range of wavelengths of UV and infrared (IR) radiation.

The UV lamp bulbs 122 may emit light across a broad band of wavelengths from 170 nm to 400 nm. The gases selected for use within the UV lamp bulbs 122 can determine the wavelengths emitted. UV light emitted from the UV lamp bulbs 122 enters the processing regions 160 by passing through windows 108 and gas distribution showerheads 110 disposed in apertures in the lid 102. The windows 108 may be made of an OH free synthetic quartz glass and have sufficient thickness to maintain vacuum without cracking. The windows 108 may be fused silica that transmits UV light down to approximately 150 nm. The showerheads 110 may be made from transparent materials such as quartz or sapphire and positioned between the windows 108 and the substrate support 124. Since the lid 102 seals to the body 162 and the windows 108 are sealed to the lid 102, the processing regions 160 provide volumes capable of maintaining pressures from approximately 1 Torr to approximately 650 Torr. Processing or cleaning gases may enter the processing regions 160 via a respective one of two inlet passages 132. The processing or cleaning gases then exit the processing regions 160 via a common outlet port 134.

Each of the housings 104 includes an aperture 115 adjacent the power sources 106. The housings 104 may include an interior parabolic surface defined by a cast quartz lining 136 coated with a dichroic film. The dichroic film usually constitutes a periodic multilayer film composed of diverse dielectric materials having alternating high and low refractive index. Therefore, the quartz linings 136 may transmit infrared light and reflect UV light emitted from the UV lamp bulbs 122. The quartz linings 136 may adjust to better suit each process or task by moving and changing the shape of the interior parabolic surface.

Figure 2:
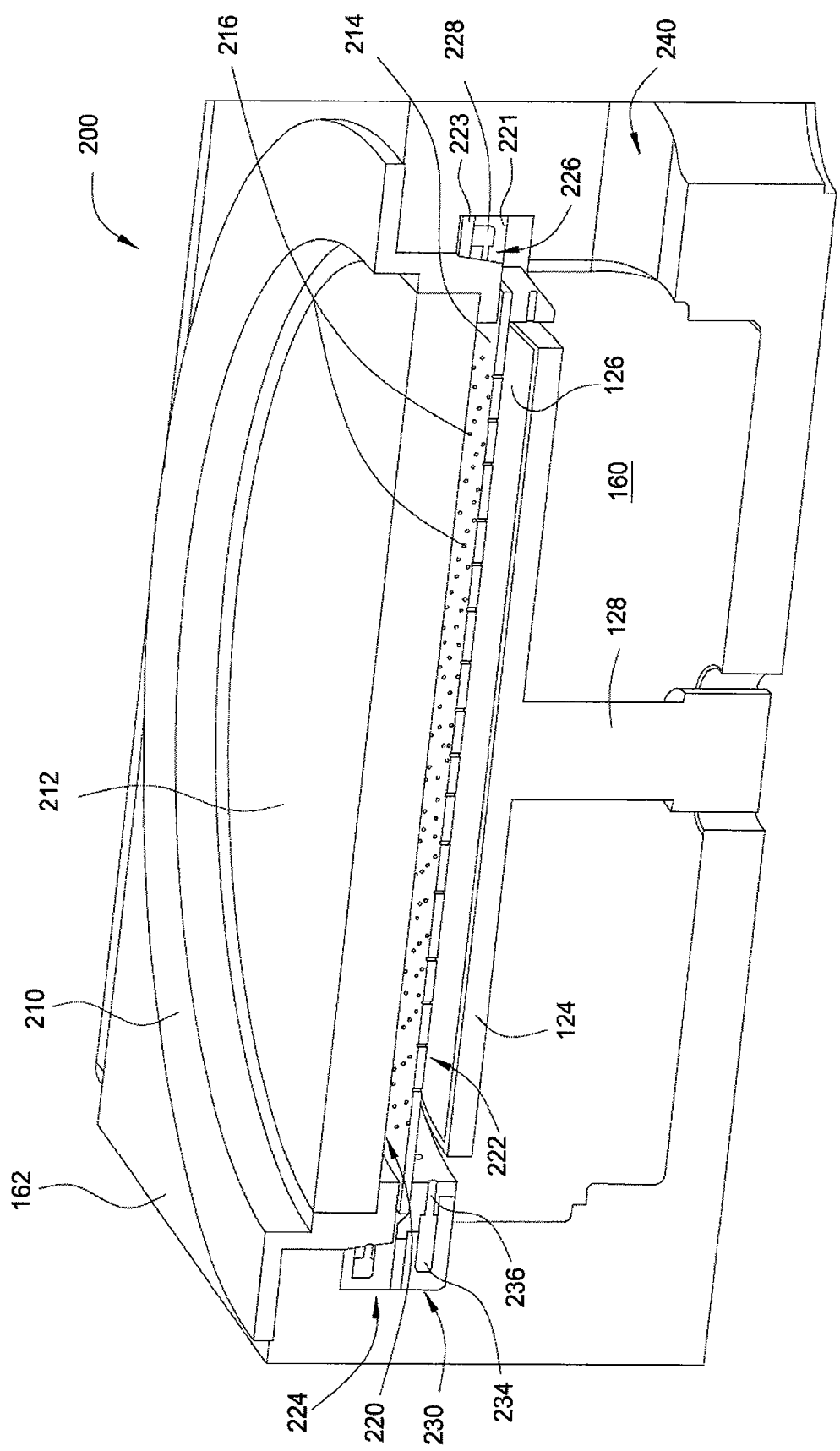
FIG. 2 is a schematic isometric cross-sectional view of a portion of one of the processing chambers without the lid assembly.

FIG. 2 shows a schematic isometric cross-sectional view of a portion of one of the processing chambers 200, which may be used alone, or in place of any of the processing region of the tandem processing chamber 100. The design of hardware shown in FIG. 2 enables a specific gas flow profile distribution across the substrate 126 being processed in a UV chamber, lamp heated chamber, or other chamber where light energy is used to process a film or catalyze a reaction, either directly on or above the substrate 126.

A window assembly is positioned within the processing chamber 200 to hold a first window, such as a UV vacuum window 212. The window assembly includes a vacuum window clamp 210 that may be directly or indirectly rested on a portion of the body 162 (FIG. 1) and supports a vacuum window 212 through which UV light may pass from the UV lamp bulbs 122. The vacuum window 212 is generally positioned between the UV radiation source, such as UV lamp bulbs 122, and the substrate support 124. A showerhead 214, which may be formed of various transparent materials such as quartz or sapphire, is positioned within the processing region 160 and between the vacuum window 212 and the substrate support 124. The transparent showerhead 214 forms a second window through which UV light may pass to reach the substrate 126. The transparent showerhead defines an upper processing region 220 between the vacuum window 212 and transparent showerhead 214 and further defines a lower processing region 222 between the transparent showerhead 214 and the substrate support, such as substrate support 124. The transparent showerhead 214 also has one or more passages 216 between the upper and lower processing regions 220, 222. The size and density of the passages 216 may be uniform or non-uniform to effectuate the desired flow characteristics across the substrate surface. The passages 216 may have either a uniform flow profile where the flow per radial area across the substrate 126 is uniform or the gas flow can be preferential to the center or edge of the substrate 126.

The front and/or back surface of the transparent showerhead 214 and vacuum window 212 may be coated to have a band pass filter and to improve transmission of the desired wavelengths or improve irradiance profile of the substrate. For example, an anti-reflective coating (ARC) layer may be deposited on the transparent showerhead 214 and vacuum window 212 to improve the transmission efficiency of desired wavelengths. The ARC layer may be deposited in a way that the thickness of the reflective coating at the edge is relatively thicker than at the center region of the transparent showerhead 214 and vacuum window 212 in a radial direction, such that the periphery of the substrate disposed underneath the vacuum windows 212 and the transparent showerhead 214 receives higher UV irradiance than the center. The ARC coating may be a composite layer having one or more layers formed on the surfaces of the vacuum window 212 and transparent showerhead 214. The compositions and thickness of the reflective coating may be tailored based on the incidence angle of the UV radiation, wavelength, and/or the irradiance intensity. A more detailed description/benefits of the ARC layer is further described in the commonly assigned U.S. patent application Ser. No. 13/301,558 filed on Nov. 21, 2011 by Baluja et al., which is incorporated by reference in its entirety.

A gas distribution ring 224 made of aluminum oxide is positioned within the processing region 160 proximate to the sidewall of the UV chamber. The gas distribution ring 224 can be a single piece, or can include a gas inlet ring 223 and a base distribution ring 221 having one or more gas distribution ring passages 226. The gas distribution ring 224 is configured to generally surround the circumference of the vacuum window 212. The gas inlet ring 223 may be coupled with the base distribution ring 221 which together may define the gas distribution ring inner channel 228. A gas supply source 242 (FIG. 3) is coupled to one or more gas inlets (not shown) formed in a surface of the gas inlet ring 223 through which gas may enter the gas distribution ring inner channel 228. The one or more gas distribution ring passages 226 couple the gas distribution ring inner channel 228 with the upper processing region 220, forming a gas flow path between the inner channel 228 and the upper processing region 220 above the transparent showerhead 214.

A gas outlet ring 230 is positioned below the gas distribution ring 224 and may be at least partially below the transparent showerhead 214 within the processing region 160. The gas outlet ring 230 is configured to surround the circumference of the transparent showerhead 214 and having one or more gas outlet passages 236 coupling a gas outlet ring inner channel 234 and the lower processing region 222, forming a gas flow path between the lower processing region 222 and the gas outlet inner channel 234. The one or more gas outlet passages 236 of the gas outlet ring 230 are disposed at least partially below the transparent showerhead 214.

Figure 3:
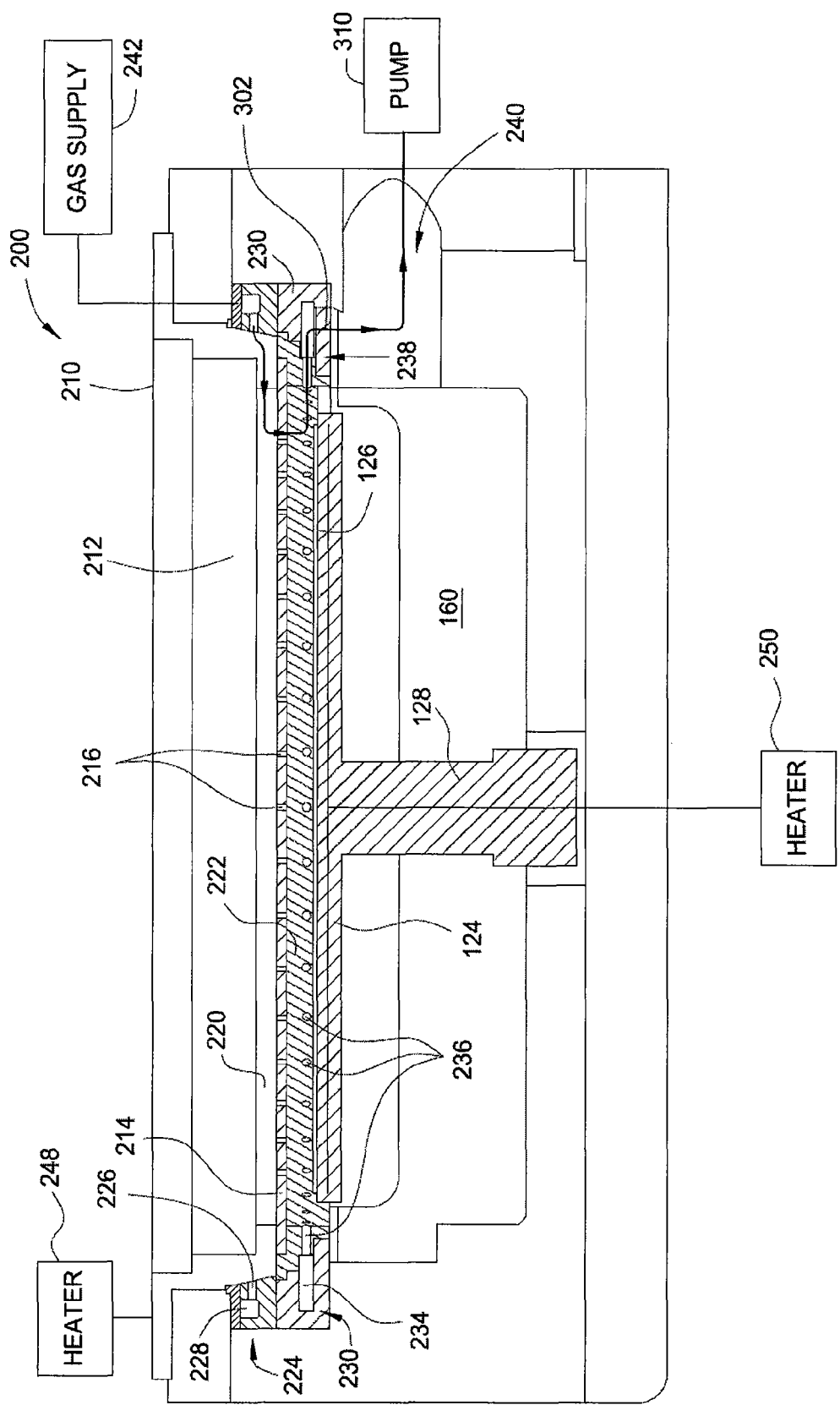
FIG. 3 is a schematic cross-sectional view of the processing chamber in FIG. 2 illustrating a gas flow path.

FIG. 3 depicts a schematic cross-sectional view of the processing chamber 200 in FIG. 2 illustrating a gas flow path. As indicated by arrow 302, a processing gas such as carbon-based precursor, silicon-based precursor, silylating agent, or other types of gases may be injected into and evenly filled the upper processing region 220 between the vacuum window 212 and the transparent showerhead 214, through the transparent showerhead 214, over the substrate support 124 which may have a substrate 126 disposed thereon, down towards the substrate from the transparent showerhead 214. The gas flow washes over the substrate 126 from above, spreads out concentrically, and exits the lower processing region 222 through gas outlet passages 236. The gas then is ejected from the lower processing region 222, enters the gas outlet ring inner channel 234, and exits the gas outlet 238 into a gas exhaust port 240 and to a pump 310. Depending on the pattern of the passages 216 in the showerhead 214, the gas flow profile may be controlled across the substrate 126 to provide a desired uniform or non-uniform distribution. The processing chamber 200 is further described in the commonly assigned U.S. patent application Ser. No. 13/248,656 filed on Sep. 29, 2011 by Baluja et al., which is incorporated by reference in its entirety.

Exemplary Curing Process

Figure 4:
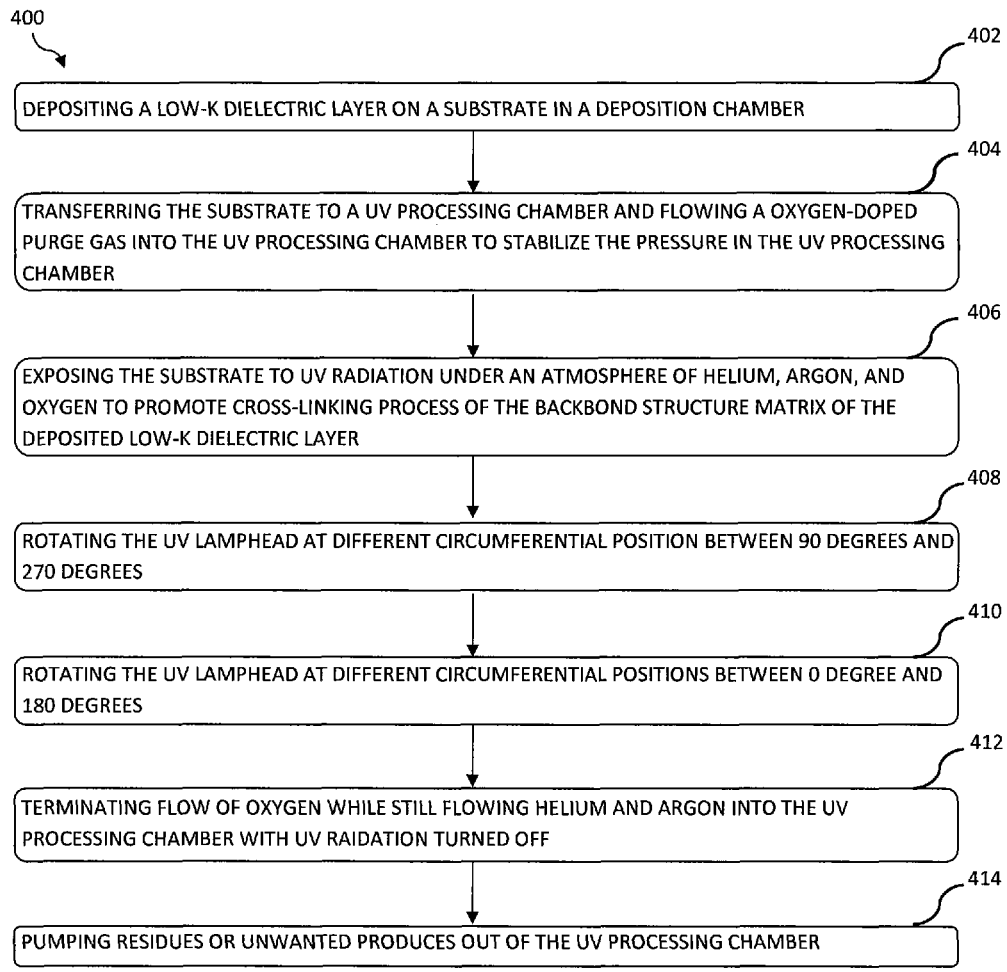
FIG. 4 illustrates an exemplary process for curing a low-k dielectric layer disposed within a UV processing chamber in accordance with one embodiment of the present invention.

FIG. 4 illustrates an exemplary process 400 for curing a low-k dielectric layer disposed within a UV processing chamber in accordance with one embodiment of the present invention. The UV processing chamber may be any UV-based chamber such as the processing chambers 100, 200 shown in FIGS. 1 and 2. It should be noted that the sequence of steps illustrated in FIG. 4 are not intended to be limiting as to the scope of the invention described herein, since one or more steps may be added, deleted and/or reordered without deviating from the basic scope of the invention. It is also noted that the processing parameters discussed in this specification is based on a substrate having a diameter of 300 mm.

The process 400 starts with step 402 by depositing a low-k dielectric layer on a substrate in a deposition processing chamber. The low-k dielectric layer may be any conventional porous, low-k, silicon based dielectric material having a k value below about 3. In one embodiment, the low-k dielectric layer is an organosilicate glass (OSG, also known as SiOCH) which is a silicon oxide contains carbon and hydrogen atoms. SiOCH may have a k value between about 2 and 3 and is available as Black Diamond II™ from Applied Materials. The low-k dielectric layer may have micro pores having diameters in the range of about 0.5 nm to about 20 nm. The low-k dielectric layer may be deposited by chemical vapor deposition (CVD), a plasma-enhanced chemical vapor deposition (PECVD) or any other suitable deposition technique.

In step 404, the substrate is transferred to a UV processing chamber and a purge gas is flowed into the UV processing chamber to stabilize the pressure/process conditions in the UV processing chamber. The flow of the purge gas may also remove organic-based residues from various exposed surfaces of optical components, such as the quartz-based vacuum window or showerhead, disposed in the UV processing chamber. The purge gas may be flowed into the UV processing chamber in a manner as described above with respect to FIG. 3. In one embodiment, the purge gas may include helium, argon, nitrogen, a combination thereof, or any suitable inert gas(es). In one example, the purge gas includes helium and argon. The purge gas may include a small amount of dopant element (e.g., about 1-500 sccm) to promote cross-linking process of the back-bone structure matrix of the deposited ultra low-k dielectric layer during the subsequent UV curing process, as will be discussed in more detail below. The dopant element may include, but is not limited to oxygen, hydrogen, ozone, or carbon dioxide. In one example, the purge gas includes oxygen as dopant element. While not discussed here, it is contemplated that any other element that is capable of reacting with the compositional elements in the deposited ultra low-k dielectric layer may also be used.

In cases where the purge gas contains helium, argon and oxygen, the helium gas may be introduced into the UV processing chamber through the UV transparent gas distribution showerhead (214 shown in FIG. 2) during the stabilization at a flow rate of about 4000 sccm to about 30000 sccm, such as about 10000 sccm to about 24000 sccm, for example about 12000 to about 16000 sccm, the argon gas may be introduced into the UV processing chamber at a flow rate of about 4000 sccm to about 30000 sccm, such as about 10000 sccm to about 24000 sccm, for example about 12000 to about 16000 sccm, and the oxygen may be introduced into the UV processing chamber at a flow rate of about 1 sccm to about 500 sccm, such as about 1 sccm to about 30 sccm, for example, about 2 to about 8 sccm, about 5 sccm to about 12 sccm, about 8 sccm to about 14 sccm, about 11 sccm to about 18 sccm, about 14 sccm to about 20 sccm, about 17 sccm to about 24 sccm, about 20 sccm to about 26 sccm, or about 23 sccm to about 29 sccm. The flow rates as described in this disclosure are based on a 300 mm diameter substrate. It is noted that flow rate may vary depending upon the size of the substrate.

In various embodiments, the ratio of the dopant element to the purge gas may be between about 1:30000 and about 1:50, for example between about 1:6400 and about 1:300, such as about 1:3200 to about 1:1060, for example 1:1600, which may vary depending upon the application and hardware design. The stabilization may be performed between about 10 seconds and about 15 seconds, with a substrate temperature maintained at about 300° C. to about 450° C., for example about 380° C. to about 385° C., and a chamber pressure of about 2 Torr to about 10 Torr, for example about 5 Torr to about 6 Torr.

In step 406, the UV radiation source, such as UV lamp bulbs 122 shown in FIG. 1, is turned on and the substrate is exposed to the UV radiation to cure and densify the deposited ultra low-k dielectric layer. During this UV curing process, the purge gas, i.e., the helium gas, the argon gas, and the oxygen gas, may continue to flow into the UV processing chamber at the same flow rate as the previous step. Therefore, the UV curing process is performed under an atmosphere of helium, argon, and oxygen. The inventors have determined that doping the purge gas with an element that is capable of reacting with the compositional elements in the deposited ultra low-k dielectric layer provides an alternate pathway to cross-linking of the back-bone structure matrix of the deposited ultra low-k dielectric layer during the UV curing process, which in turn accelerates cross-linking efficiency of the deposited ultra low-k dielectric layer.

In cases where the deposited ultra low-k dielectric layer is SiOCH, the low-k dielectric layer may contain Si—O—Si structure matrix having many terminal groups such as free methyl (—$CH_3$) or ethyl (—$C_2H_5$) groups attached to the Si—O—Si matrix. In such a case, oxygen in the purge gas is believed to promote cross-linking process of Si—O—Si through conversion of cage-like Si—O structures to network Si—O structures. The addition of oxygen in the purge gas also increases Si—O, C—H, and Si—$CH_3$ bonds in the deposited ultra low-k dielectric layer, resulting in decrease in Si—H and Si—C bonding in the deposited ultra low-k dielectric layer (as evidenced by FIG. 5). As shown below in Table 1, it has been proved that the promotion of cross-linking of Si—O—Si structure matrix in the deposited ultra low-k dielectric layer may result in UV cure time reduction up to 35% by using up to 30 sccm of oxygen in the purge gas. Therefore, the production throughput is increased. While having improved throughput and some structural changes, the film properties of the deposited ultra low-k dielectric film such as shrinkage and refractive index remain substantially unchanged, as compared to the existing carbon-doped oxide films (such as Black Diamond™ series) cured using conventional oxygen-free purge gas.

TABLE 1

| Parameter | Carbon-doped oxide films cured by conventional UV process | Carbon-doped oxide films cured by O2-doped UV curing process 30 sccm $O_2$ |
|---|---|---|
| UV Cure Time (sec) | 280 | 180 |
| Shrinkage | 15 | 15.2 |
| Refractive Index | 1.3469 | 1.3452 |

Figure 5:
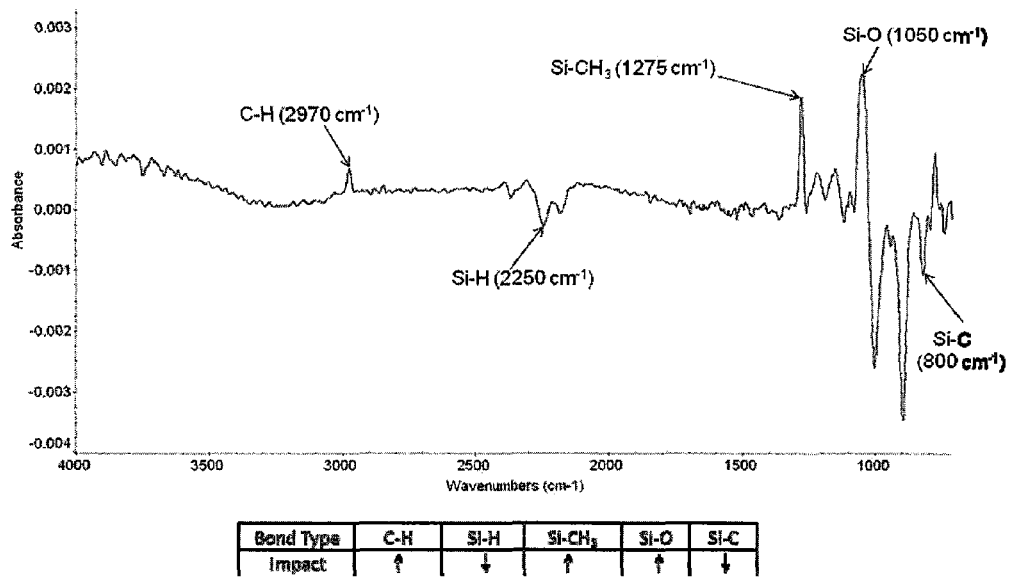
FIG. 5 is a difference between a FTIR spectrum of a UV cured carbon doped silicon oxide film illustrating the main bonding differentiation between the inventive UV curing process using oxygen-doped (5 sccm) purge gas and the conventional UV curing process using an oxygen-free purge gas.
Figure 6:
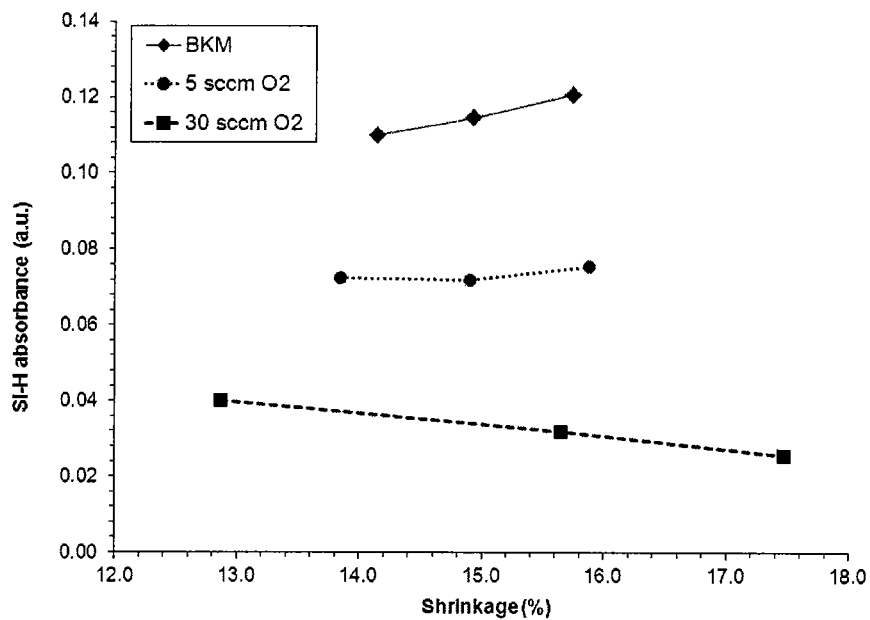
FIG. 6 illustrates a comparison of Si—H bonds absorbance intensity (a.u.) as a function of shrinkage (%) between a deposited carbon doped silicon oxide film using a conventional oxygen-free UV curing process (BKM) and a deposited carbon doped silicon oxide film using inventive UV curing process running oxygen gas at different oxygen doping level.

FIG. 5 is a FTIR difference spectrum of a UV cured carbon doped silicon oxide film illustrating the main bonding differentiation between the inventive UV curing process using oxygen-doped (5 sccm) purge gas and the conventional UV curing process using an oxygen-free purge gas. As highlighted in FIG. 5, upon exposure to UV radiation with oxygen-doped purge gas, the peak absorbance intensity of the Si—H bonds (at 2250 $cm^{-1}$) and Si—C bonds (at 785 $cm^{-1}$) decreased, while the peak absorbance intensity of C—H bonds (at 2970 $cm^{-1}$), network Si—O structures (at 1050 $cm^{-1}$), and Si—$CH_3$ bonds (at 1275 $cm^{-1}$) increased. FIG. 5 and the Table 1 demonstrate that while there are small difference in film structure between the carbon doped silicon oxide film cured using the inventive UV curing method and the conventional UV curing approach, no significant differences between film properties have been observed. FIG. 6 illustrates a comparison of Si—H bonds absorbance intensity (a.u.) as a function of shrinkage (%) between a deposited carbon doped silicon oxide film using a conventional oxygen-free UV curing process (BKM) and a deposited carbon doped silicon oxide film using inventive UV curing process running oxygen gas at 5 sccm and 30 sccm. FIG. 6 shows that the Si—H bonds absorbance drop with increased $O_2$ concentration, which could be related to corresponding increase in Si—O, C—H and Si—$CH_3$ bonds in the deposited ultra low-k dielectric layer.

Figure 7:
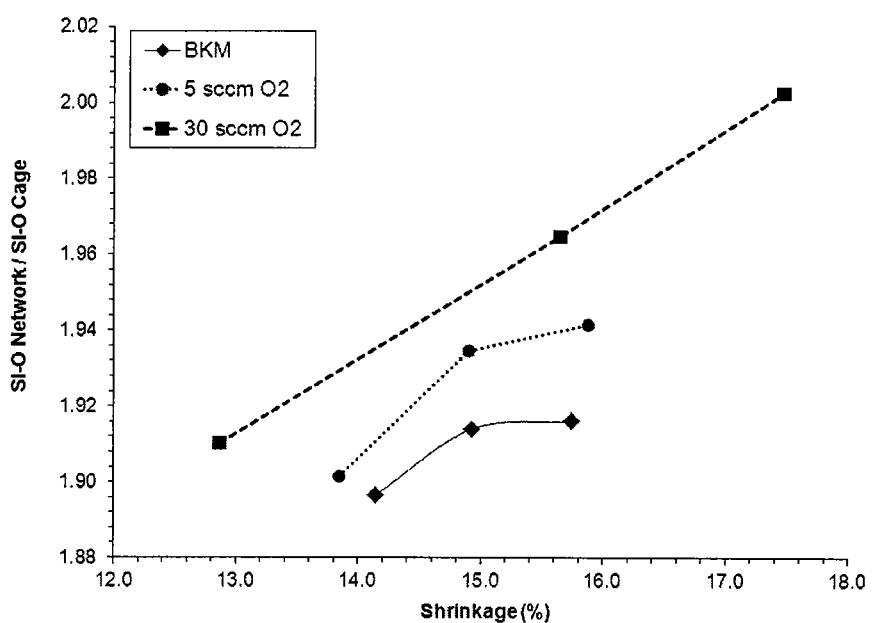
FIG. 7 illustrates a comparison of Si—O network to cage ratio as a function of shrinkage (%) between a deposited carbon doped silicon oxide film using a conventional oxygen-free UV curing process and a deposited carbon doped silicon oxide film using inventive UV curing process at different oxygen doping level.

FIG. 7 illustrates a comparison of Si—O network to cage ratio as a function of shrinkage (%) between a deposited carbon doped silicon oxide film using a conventional oxygen-free UV curing process (BKM) and a deposited carbon doped silicon oxide film using inventive UV curing process with different oxygen doping level (e.g., 5 sccm and 30 sccm). The plot is drawn based on a substrate having a diameter of 300 mm. As can be seen in FIG. 7, Si—O network/cage peaks ratio increases with the $O_2$ doping concentration of the purge gas during UV curing process, indicating that the cross-linking process is improved by conversion of Si—O cage-type structure to Si—O network structure.

During the UV curing process, the substrate may be cured at a UV intensity of about 100 mW/cm$^2$ to about 2000 mW/cm$^2$ for about 2 seconds and about 20 minutes, for example about 4 minutes. The spacing between the showerhead, for example the transparent showerhead 214 (FIG. 2), and the substrate support, for example the substrate support 124 (FIG. 2) may be between about 600 mils and about 2000 mils, for example about 1200 mils. The substrate temperature and the chamber pressure may remain unchanged at about 380° C. to about 385° C. and about 5 Torr to about 6 Torr, respectively. The UV radiation source (e.g., UV lamp bulbs 122 shown in FIG. 1) and the substrate support (e.g., substrate support 124), may or may not rotate during the UV curing process.

In step 408, while the UV radiation source is on, the lamp head assembly (e.g., UV lamp bulbs 122) is rotated at different circumferential positions between 90 degrees and 270 degrees at a velocity of about 4 rpm, which may vary depending upon the curing process. Alternatively, the lamp assembly may keep still while continuously rotating the substrate support. The helium gas, the argon gas, and the oxygen gas may continue to flow into the UV processing chamber at the same rate as previous step. In one example, the oxygen gas and the purge gas are flowed for only a short period of time (e.g., 0.1 second to 120 seconds) during the UV curing process while continuously rotating the substrate support. The substrate temperature and the chamber pressure may remain unchanged at about 380° C. to about 385° C. and about 5 Torr to about 6 Torr, respectively.

In step 410, while the UV radiation source is on, the lamp assembly is rotated again at different circumferential positions between 0 degree and 180 degrees at a velocity of about 4 rpm, which may vary depending upon the curing process. Alternatively, the lamp assembly may keep still while continuously rotating the substrate support. The helium gas, the argon gas, and the oxygen gas may continue to flow into the UV processing chamber at the same rate as previous step. The substrate temperature and the chamber pressure may remain unchanged at about 380° C. to about 385° C. and about 5 Torr to about 6 Torr, respectively.

In step 412, the flowing of the oxygen is terminated while still flowing the helium gas and the argon gas into the UV processing chamber at the same rate of about 16000 sccm for purging purpose. The substrate temperature and the chamber pressure may remain unchanged at about 380° C. to about 385° C. and about 5 Torr to about 6 Torr, respectively. The UV radiation source may be turned off and the spacing between the showerhead and the substrate support may be increased to about 1600 mils. This purging step may be performed for about 2 seconds and about 60 seconds, such as about 5 seconds.

In step 414, the resulting produces and decomposed residues are evacuated or pumped out of the UV processing chamber via the gas exhaust port 240 (FIG. 2) to complete the UV curing process. During the pump-out, the UV radiation source (if on) is turned off, and the helium gas and the argon gas are stopped flowing into the UV processing chamber. The pump-out may be performed for about 3 seconds to about 20 seconds, for example 5 seconds.

Upon completion of the UV curing, the substrate deposited with the low-k dielectric layer of about 5000 Å or less in thickness is removed from the UV processing chamber and a post-cleaning process may be performed within the UV processing chamber to remove any unwanted deposition build-up or carbon-based residues from the exposed surfaces of the chamber components. During the post cleaning process, an oxygen-containing gas, such as ozone, may be flowed into the UV processing chamber at a flow rate of about 6000 sccm to about 16000 sccm, for example about 10000 sccm. The oxygen-containing gas may be flowed into the UV processing chamber in a manner as described above with respect to FIG. 3. The flow rates as described in this disclosure are based on a 300 mm diameter substrate. It is noted that flow rate may vary depending upon the size of the substrate.

Production of the necessary ozone may be done remotely with the ozone transported to the processing chamber, generated in-situ by activating oxygen with UV light to create ozone, or accomplished by running these two schemes simultaneously. Other oxygen-containing gas such as oxygen ($O_2$) gas, nitrous oxide ($N_2O$), nitrogen monoxide (NO), carbon monoxide (CO), carbon dioxide ($CO_2$), or combinations thereof is contemplated. The UV radiation source at a UV intensity of about 100 mW/cm$^2$ to about 2000 mW/cm$^2$ may be used to more effectively break down ozone into molecular oxygen and reactive oxygen radicals, which can oxidize/react with carbon-based residues (resulted from prior process such as the silylation process) formed on the exposed surfaces of the chamber components to produce carbon dioxide and water as the resulting products, thereby cleaning the chamber components. The total time of the post cleaning process may range between about 10 seconds and about 10 minutes.

Embodiments of the invention advantageously reduce UV cure time of deposited ultra low-k dielectric films by using an oxygen-doped purge gas during the UV curing process. Oxygen, or any other element that is capable of reacting with the compositional elements in the deposited ultra low-k dielectric film, provides an alternate pathway to cross-linking of the back-bone structure matrix of the deposited ultra low-k dielectric layer during the UV curing process, thereby accelerating cross-linking efficiency of the deposited ultra low-k dielectric layer. Therefore, the production throughput is increased. While having improved throughput, the film properties of the deposited ultra low-k dielectric film remain substantially unchanged as compared to the existing carbon-doped silicon oxide films (such as Black Diamond™ series).

While the foregoing is directed to embodiments of the invention, other and further embodiments of the invention may be devised without departing from the basic scope thereof. The scope of the invention is determined by the claims that follow.

The invention claimed is:

1. A method for processing a substrate, comprising:
   depositing an ultra low-k dielectric layer having a dielecric constant of less than about 2.5 on a substrate supported by a substrate support in a deposition chamber; and
   subjecting the deposited ultra low-k dielectric layer to a ultraviolet (UV) curing process in a UV processing chamber, comprising:
   stabilizing the UV processing chamber by flowing a purge gas and an oxygen gas into the UV processing chamber at a flow ratio of about 1 (oxygen gas):6400 (purge gas) to about 1 (oxygen gas):300 (purge gas), wherein the oxygen gas is flowed into the UV processing chamber at a flow rate of about 1.0 sccm to about 30 sccm for a 300 mm diameter substrate;
exposing the deposited ultra low-k dielectric layer to UV radiation;
terminating flow of the oxygen gas while still flowing purge gas into the UV processing chamber with UV radiation turned off or remains on; and
pumping residues and unwanted produces out of the UV processing chamber.

2. The method of claim 1, wherein the ultra low-k dielectric layer comprises carbon-doped silicon oxides.

3. The method of claim 1, wherein the purge gas comprises helium gas, argon gas, nitrogen gas, or a combination thereof.

4. The method of claim 1, wherein the deposited ultra low-k dielectric layer is exposed to UV radiation at a UV intensity of about 100 mW/cm$^2$ to about 2000 mW/cm$^2$ for about 2 seconds to about 20 minutes.

5. The method of claim 1, further comprising:
rotating a UV source at different circumferential positions between 90 degrees and 270 degrees or between 0 degree and 180 degrees.

6. The method of claim 1, further comprising:
flowing the oxygen gas and the purge gas for only a short period of time during the UV curing process while continuously rotating the substrate support.

7. A method for processing a substrate, comprising:
depositing an ultra low-k dielectric layer having a dielecric constant of less than about 2.5 on a substrate in a deposition chamber;
transferring the substrate to an ultraviolet (UV) processing chamber;
flowing an oxygen gas and a purge gas comprising helium gas and argon gas into the UV processing chamber at a flow ratio of about 1 (oxygen gas): 6400 (purge gas) to about 1 (oxygen gas):300 (purge gas), wherein the oxygen gas is flowed into the UV processing chamber at a flow rate of about 1.0 sccm to about 30 sccm for a 300 mm diameter substrate;
exposing the deposited ultra low-k dielectric layer to UV radiation;
turning off UV radiation or remains on;
terminating flow of the oxygen gas while still flowing helium gas and argon gas into the UV processing chamber; and
pumping residues and unwanted produces out of the UV processing chamber.

8. The method of claim 7, wherein the ultra low-k dielectric layer comprises carbon-doped silicon oxides.

9. The method of claim 7, further comprising rotating a UV source at different circumferential positions between 0 degree and 270 degrees, or continuously rotating the substrate support during the process.

10. The method of claim 7, further comprising:
transferring the substrate out of the UV processing chamber;
introducing an oxygen-containing gas into an upper processing region of the UV processing chamber, the upper processing region located between a transparent window and a transparent showerhead positioned within the UV processing chamber;
flowing the oxygen-containing gas through one or more passages formed in the transparent showerhead and into a lower processing region, the lower processing region located between the transparent showerhead and a substrate support located within the UV processing chamber;
exposing the oxygen-containing gas to UV radiation to generate reactive oxygen radicals; and
removing unwanted residues or deposition build-up from exposed surfaces of chamber components presented in the UV processing chamber using the reactive oxygen radicals.

11. The method of claim 10, wherein the introducing oxygen-containing gas into the upper processing region further comprises:
flowing the oxygen-containing gas radially from a gas distribution ring configured to surround a circumference of the transparent window to one or more passages formed in the transparent showerhead.

12. The method of claim 11, further comprising:
ejecting the oxygen-containing gas radially from the lower processing region into a gas outlet ring configured to surround a circumference of the transparent showerhead.

13. The method of claim 10, wherein the oxygen-containing gas comprises ozone ($O_3$) gas, oxygen ($O_2$) gas, nitrous oxide ($N_2O$), nitrogen monoxide (NO), carbon monoxide (CO), carbon dioxide ($CO_2$), or a combination thereof.

14. The method of claim 1, wherein the oxygen is flowed into the UV processing chamber at a flow rate of about 1 sccm to about 30 sccm.

15. The method of claim 7, wherein the oxygen is flowed into the UV processing chamber at a flow rate of about 1 sccm to about 30 sccm.

16. A method for processing a substrate, comprising:
subjecting an ultra low-k dielectric layer having a dielecric constant of less than about 2.5 to a ultraviolet (UV) curing process in a UV processing chamber, comprising:
flowing a purge gas and an oxygen gas into the UV processing chamber at a flow ratio of about 1 (oxygen gas):6400 (purge gas) to about 1 (oxygen gas):300 (purge gas), wherein the oxygen gas is flowed into the UV processing chamber at a flow rate of about 1.0 sccm to about 30 sccm for a 300 mm diameter substrate; and
exposing the ultra low-k dielectric layer to UV radiation.

17. The method of claim 16, wherein the oxygen is flowed into the UV processing chamber at a flow rate of about 5 sccm to about 12 sccm.

* * * * *

UNITED STATES PATENT AND TRADEMARK OFFICE
CERTIFICATE OF CORRECTION

PATENT NO.       : 8,753,449 B2
APPLICATION NO.  : 13/904468
DATED            : June 17, 2014
INVENTOR(S)      : Chhabra et al.

It is certified that error appears in the above-identified patent and that said Letters Patent is hereby corrected as shown below:

In the Claims:

Column 10, Claim 1, Line 58, please delete "dielecric" and insert --dielectric-- therefor;

Column 11, Claim 7, Line 28, please delete "dielecric" and insert --dielectric-- therefor;

Column 12, Claim 16, Line 41, please delete "dielecric" and insert --dielectric-- therefor.

Signed and Sealed this
Thirtieth Day of September, 2014

Michelle K. Lee
*Deputy Director of the United States Patent and Trademark Office*